US007679978B1

(12) United States Patent
Su et al.

(10) Patent No.: US 7,679,978 B1
(45) Date of Patent: Mar. 16, 2010

(54) SCHEME FOR SCREENING WEAK MEMORY CELL

(75) Inventors: Hua-Yu Su, Milpitas, CA (US); Raymond A Heald, Los Altos, CA (US); Wen-Jay Hsu, Fremont, CA (US); Paul J. Dickinson, San Jose, CA (US); Venkatesh P Gopinath, Fremont, CA (US); Lik T Cheng, San Jose, CA (US); Shih-Huey Wu, Milpitas, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 340 days.

(21) Appl. No.: 11/827,542

(22) Filed: Jul. 11, 2007

(51) Int. Cl.
*G11C 29/00* (2006.01)

(52) U.S. Cl. ............. 365/201; 365/185.09; 365/185.22; 365/185.21; 365/185.18; 365/185.02

(58) Field of Classification Search ................. 365/201, 365/185.09, 185.22, 185.21, 185.18, 185.02
See application file for complete search history.

(56) References Cited

U.S. PATENT DOCUMENTS

| 5,432,745 | A  | * | 7/1995  | Tomita et al. ............... 365/201 |
| 5,654,925 | A  | * | 8/1997  | Koh et al. .................... 365/201 |
| 5,905,675 | A  | * | 5/1999  | Madurawe et al. ...... 365/185.18 |
| 6,026,038 | A  | * | 2/2000  | Cho et al. .................... 365/201 |
| 6,041,002 | A  | * | 3/2000  | Maejima ...................... 365/201 |
| 6,256,241 | B1 | * | 7/2001  | Mehalel ....................... 365/201 |
| 6,266,286 | B1 | * | 7/2001  | Cho et al. .................... 365/201 |
| 6,349,065 | B1 | * | 2/2002  | Ooishi ......................... 365/201 |
| 6,552,941 | B2 | * | 4/2003  | Wong et al. .................. 365/201 |
| 6,631,086 | B1 | * | 10/2003 | Bill et al. ............... 365/185.09 |
| 6,704,231 | B1 | * | 3/2004  | Morishita et al. ........... 365/201 |

(Continued)

FOREIGN PATENT DOCUMENTS

JP 08248310 * 9/1996

*Primary Examiner*—Viet Q Nguyen
(74) *Attorney, Agent, or Firm*—Martine Penilla & Gencarella, LLP

(57) ABSTRACT

A novel scheme for screening weak memory cell includes a cell coupled to a leakage stress delivery circuitry (LSDC), which, in turn, is coupled to an induced leakage adjustment control (ILAC). The LSDC includes a combination of PMOS transistors, NMOS transistors or both PMOS and NMOS transistors that are controlled by a plurality of stress inducing signals. The PMOS and/or NMOS transistors of the LSDC are coupled to a pair of complementary data lines. The complementary data lines are inputs to a sense amplifier and are outputs of a write driver. The ILAC controls the quantity of the leakage stress applied through the LSDC to the pair of complementary data lines. The ILAC further includes a leakage varying circuitry that is configured to adjust the leakage stress applied to the complementary data lines through the LSDC. The applied leakage stress is adjusted to establish a desired pass/fail threshold and to detect other process variations or defects so that the sense amplifier can be applied to detect the voltage differential during a read operation. The applied leakage stress can also be applied to write driver circuitry such that a write driver along with the applied stress provide enough voltage level to screen difficult-to-write cell from a easy-to-write cell during a write operation. The plurality of stress inducing signals are controlled such that the appropriate leakage stress may be applied to force a leakage to Vdd or Vss associated with the cell through the complementary data lines.

15 Claims, 11 Drawing Sheets

(Leakage stress delivery circuitry)

U.S. PATENT DOCUMENTS

| | | | |
|---|---|---|---|
| 6,950,356 B2 * | 9/2005 | Tao | 365/201 |
| 7,099,224 B2 * | 8/2006 | Chou | 365/226 |
| 7,110,282 B2 * | 9/2006 | Kono et al. | 365/149 |
| 7,400,162 B2 * | 7/2008 | Gattiker et al. | 324/765 |
| 7,512,004 B2 * | 3/2009 | Hara | 365/185.14 |

* cited by examiner (Leakage stress delivery circuitry)

(ILAC with cpi generator)

(ILAC with cni generator)

*Input control table for Memory Cell stress circuits*

| Option | P_sel1 | P_sel2 | n_sel1 | n_sel2 | Description |
|---|---|---|---|---|---|
| 1 | H | L | L | L | Leakage stress from Vdd to data through m18 & m5. The current is controlled by level of cpi |
| 2 | L | H | L | L | Leakage stress from Vdd to data_l through m6 & m4. The current is controlled by level of cpi |
| 3 | H | H | H | L | Leakage stress from Vss to data_l through m3 & m2. The current is controlled by level of cni |
| 4 | H | H | L | H | Leakage stress from Vss to data through m0 & m1. The current is controlled by level of cni |
| 5 | H | L | H | L | Combine option (1) & (3) to further stress the cell from both data & data_l sides |
| 6 | L | H | L | H | Combine option (2) & (4) to further stress the cell from both data & data_l sides |

*Note:* H = Logic level High; L = Logic level Low

Figure 6

SCHEME FOR SCREENING WEAK MEMORY CELL

FIELD OF THE INVENTION

The present invention relates generally to a semiconductor device, and more particularly to a scheme for effectively screening weak memory cells in a semiconductor device.

BACKGROUND

Description of the Related Art

In a semiconductor device manufacturing process, various fabrication operations used in manufacturing a semiconductor device may leave certain defects on the device causing the devices to fail during operation. These defects may be due to process variation, defect during process, and/or latent defect. The process variations or defect during process may be caused during various fabrication operations, handling in-between fabrication operations, due to impurities in the ambient air that may settle on the semiconductor device or due to other causes. To ensure operability of these semiconductor devices, such as memory cells, including storage devices like registers or latches, each individual device is tested after fabrication. When higher reliability is needed, a more extensive testing is performed on the devices. For example, the devices may be tested at different temperature ranges to ensure the operability of the device over a specified temperature range. Alternatively, the device may be tested over a specified voltage range to determine failures. In some instances, the devices may be tested after a prescribed "burn-in" period, typically, 24 to 48 hours, wherein the device is operated during the burn-in period. If the device is likely to fail during operation, there is a high probability that the device will fail during the burn-in period.

Some of the techniques used in testing semiconductor devices involve using voltage and temperature controls. For example, the voltage controls provide back-body bias to control the driving strength of semiconductor device transistors so that a weak cell may be differentiated from a strong cell based on the way the cells handle the back-bias. However, this technique has its drawback of determining how much back-body bias may be applied without damaging the devices and how effective the changes in the transistor threshold voltage are with the applied back-body bias.

Due to shrinking in size of these devices over time, the individual cells and the individual devices within the cell are also shrinking. This leads to more variation to the transistor threshold voltage within the cell that can make the identification of weak and strong cells much more difficult. Additionally, the voltage and temperature variation may lead to more damage to the semiconductor devices than help in identifying the defective or weak cells. Other techniques include a weak-write test using a diode drop to change the amount of writability. However, this test is crude and exposes the cells to unnecessary stress and is not robust enough to catch weak defective cells.

It would, therefore, be beneficial to have a technique or a scheme that effectively screens weak cells in a semiconductor device without damaging the device. It would also be beneficial to have the screening technique that is easy to implement, is flexible and does not require any back-body bias or high-temperature to test and weed out the weak cells in the semiconductor device. It would also be beneficial to have a screening technique that is flexible enough to be combined with any back-body bias or high-temperature to test the weak cells in the semiconductor device, if desired. It would also be beneficial if the technique includes minimal modification to the existing circuit and does not use too much overhead.

SUMMARY

The present invention fills the need by providing a scheme that effectively screens weak cells in a circuit. According to the scheme, each cell is coupled (through column switch circuitry and data lines) to a leakage stress delivery circuitry (LSDC) which is, in turn, coupled to a induced leakage adjustment control (ILAC). The LSDC comprises a combination of PMOS transistors, NMOS transistors or both PMOS transistors and NMOS transistors that are controlled by a plurality of stress inducing signals. The PMOS and/or NMOS transistors of the LSDC are coupled to a pair of complementary data lines. The complementary data lines are inputs to a sense amplifier and are outputs of a write driver. The ILAC controls the leakage stress applied to the complementary data lines through the LSDC. The ILAC further includes a leakage varying circuitry that is configured to adjust the leakage stress applied to the pair of complementary data lines in the LSDC. The applied leakage stress is adjusted to allow the sense amplifier to detect and track a desired pass/fail threshold and other process variations that may occur within the LSDC and affect the cell. The plurality of stress inducing signals is controlled such that the appropriate leakage stress may be applied to force a leakage to Vdd or Vss associated with the cell through the complementary data lines. It should be appreciated that the present invention can be implemented in numerous ways such as systems and apparatuses.

In one embodiment, an apparatus for effectively screening a weak cell in a (memory) circuit is disclosed. The apparatus includes a cell indirectly coupled to a leakage stress delivery circuitry (LSDC), which, in turn, is coupled to an induced leakage adjustment control (ILAC). The LSDC includes a combination of PMOS transistors, NMOS transistors or both PMOS transistors and NMOS transistors that are controlled by a plurality of stress inducing signals. The PMOS and/or NMOS transistors of the LSDC are coupled to a pair of complementary data lines. The complementary data lines are inputs to a sense amplifier and are outputs of a write driver. The ILAC controls the quantity of the leakage stress applied to the LSDC to the pair of complementary data lines. The ILAC further includes a leakage varying circuitry that is configured to adjust the leakage stress applied to the complementary data lines through the LSDC. The applied leakage stress is adjusted so as to allow the sense amplifier to detect and track a desired pass/fail threshold and other process variations that may occur within the LSDC and affect the cell. The plurality of stress inducing signals are controlled such that the appropriate leakage stress may be applied to force a leakage to Vdd or Vss associated with the cell through the complementary data lines.

In another embodiment, an apparatus for effectively screening a weak cell in a (memory) circuit is disclosed. The apparatus includes a cell coupled to a leakage stress delivery circuitry (LSDC) (through column switch circuitry or direct connection) and an induced leakage adjustment control (ILAC) that is coupled to the LSDC. The LSDC includes a combination of PMOS transistors, NMOS transistors or both PMOS transistors and NMOS transistors that are controlled by a plurality of stress inducing signals. The PMOS and/or NMOS transistors of the LSDC are coupled to a data line. The data line is further connected to a single-ended sense amplifier and a write driver to perform a read or write operation. The ILAC controls the quantity of the leakage stress applied to the data line through the LSDC. The ILAC includes a leakage varying circuitry configured to adjust the leakage stress applied to the data line in the LSDC. The applied leakage stress is adjusted so as to allow the sense amplifier to detect and track a desired pass/fail threshold and other process variations that may occur within the LSDC and affect the cell. The plurality of stress inducing signals is controlled such that the appropriate leakage stress may be applied to force a leakage to Vdd or Vss associated with the cell through the data line.

The present invention, thus, describes method and apparatuses for effectively screening a weak cell in a (memory) circuit. The embodiments of the invention include simple and basic circuitry that are easy to implement without creating much overhead. The applied stress can be adjusted without fear of damaging the circuit. The embodiments of the invention provide flexibility to choose which data line to apply the varying leakage stress and how to stress (leakage to Vdd, leakage to Vss or no leakage) so that the sense amplifier can detect and track desired pass/fail thresholds and/or other process variations that affect the cell.

BRIEF DESCRIPTION OF THE DRAWINGS

The invention may best be understood by reference to the following description taken in conjunction with the accompanying drawings. These drawings should not be taken to limit the invention to the preferred embodiments, but are for explanation and understanding only.

FIG. 6 illustrates an input control table for a Memory Cell stress circuits, in one embodiment of the invention.

DETAILED DESCRIPTION

Figure 1:
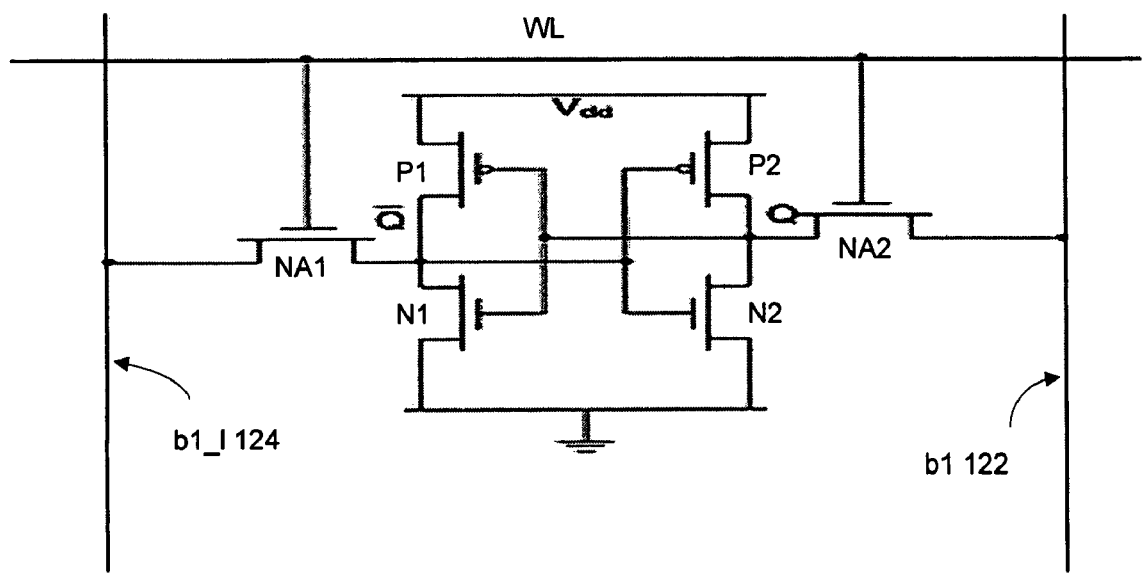
FIG. 1 illustrates a basic SRAM circuitry, in one embodiment of the invention.

The present invention provides a scheme for effectively screening a weak cell in a circuit. The scheme provides an apparatus that includes a cell indirectly coupled to a leakage stress delivery circuitry (LSDC). The LSDC is configured to receive a variable leakage stress from an induced leakage adjustment control (ILAC) coupled to the LSDC. The LSDC includes anyone of a combination of p-type metal oxide semiconductor (PMOS) transistors, n-type metal oxide semiconductor (NMOS) transistors, or both PMOS and NMOS transistors that are controlled by a plurality of stress inducing signals. The PMOS and/or NMOS transistors are connected to a pair of data lines that are complementary to each other. The complementary data lines are inputs to a sense amplifier (sa) and are outputs of a write driver (wd). The output voltage at the ILAC controls the quantity of the leakage stress applied to the LSDC. The leakage stress is adjusted using a leakage varying circuitry within the ILAC by controlling the plurality of stress inducing signals. The sense amplifier, when activated, is configured to detect the voltage differentials between the two complementary data lines with the applied leakage stress and to detect and track other process variations so that the weak cells may be properly screened.

The advantages of the proposed scheme are numerous. There is no need to apply high voltage or high temperature to identify the weak cells. The induced leakage applied to the data lines can be scaled up or down by using an induced leakage adjustment control. A sense amplifier can be applied to detect the voltage differential between the data lines to establish a pass/fail threshold for the cells. High voltage and high temperature are more likely to cause damage to the cells and hence to the semiconductor devices. The proposed scheme allows for efficient detection of strong and weak cells without damaging the cell circuitry. The weak cells may be caused during fabrication process due to process variations, defects during process or latent defect. The scheme provides great flexibility by providing options to choose which data lines to stress and how to stress these data lines (leakage to Vdd, leakage to Vss or no leakage). Further, the scheme involves minimal modification to the existing circuitry and small area overhead. The small overhead may be accomplished by allowing the LSDC and ILAC to be placed in the Input-Output slice rather than in a cell array.

To facilitate an understanding of the various embodiments, a simplified circuit of a static random access memory (SRAM) cell will be described first. The features of the disclosed embodiments will then be described with reference to the simplified circuit. The present invention is not restricted to a SRAM cell to identify the weak cells and the strong cells. The invention can be extended to any type of circuit where a stress may be applied to identify and track various process operations. With this understanding in mind, it should be appreciated that the present invention can be implemented in different ways such as apparatuses and methods. It will be apparent to those skilled in the art that the present invention may be practiced without some or all of the specific details set forth herein.

SRAMs are typically configured as an array of memory cells, wherein each individual memory cell is coupled to a wordline and a pair of complementary bitlines. To select a particular memory cell during a read operation, memory accessing circuitry is commonly utilized. For example, memory access circuit components typically include addressing circuitry for selecting a group of memory cells, wordline drivers for driving a selected wordline, sense amplifiers for amplifying the signals read from the selected memory cells, and output buffers for driving data out of the memory.

FIG. 1 illustrates a simplified circuitry of a single SRAM memory cell. As mentioned, a typical SRAM includes an array of SRAM cells arranged in rows and columns. Each SRAM cell is capable of storing a binary voltage value representing a logical data bit. A SRAM cell includes a pair of cross-coupled devices such as inverters. FIG. 1 illustrates a six-transistor SRAM memory cell, in one embodiment of the invention. A first inverter is comprised of an N-type metal-oxide semiconductor (NMOS) storage transistor, N1, and a P-type metal-oxide semiconductor (PMOS) load transistor, P1. A second inverter is comprised of an NMOS storage transistor, N2, and a PMOS load transistor, P2. The memory cell includes a pair of pass gates, NA1 and NA2 that are activated by a word line WL. Each of the pass gates NA1 and NA2 act as switches and are coupled between the pair of inverter circuits and the pair of complementary bit lines, b1 122 and b1_1 124.

Figure 2:
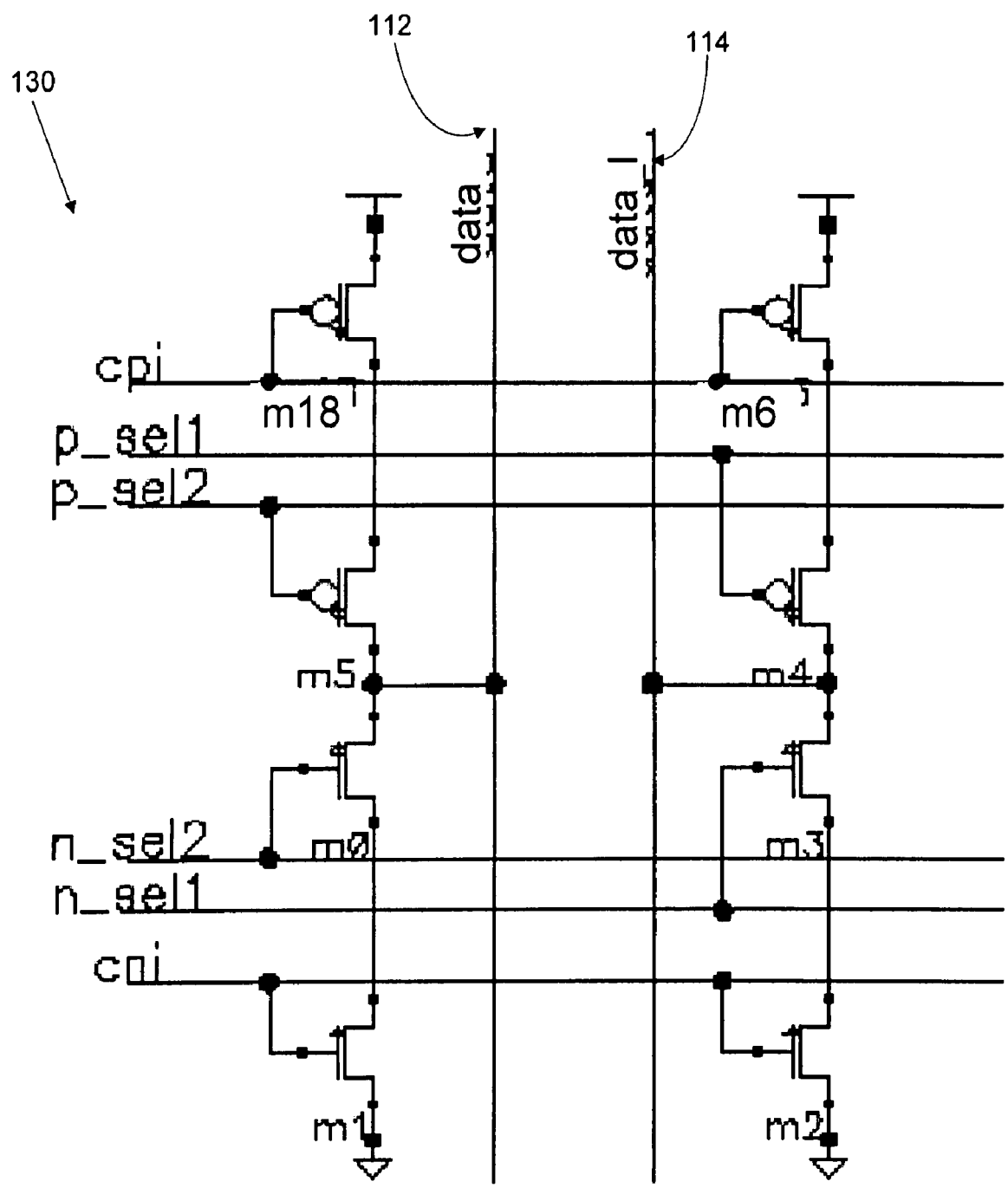
FIGS. 2, 2A and 2B illustrate a sample leakage stress delivery circuitry coupled to an SRAM, in one embodiment of the invention.

FIG. 2 illustrates a sample leakage stress delivery circuitry 130, in one embodiment of the invention. As shown, the leakage stress delivery circuitry (LSDC) 130 includes 4 PMOS transistors (m4, m5, m6 and m18) and four NMOS transistors (m0, m1, m2 and m3). The PMOS and NMOS transistors (m4, m5, m6, m18, m0, m1, m2 and m3) are controlled by a set of stress inducing signal lines (cpi, p_sel1, p_sel2, cni, n_sel1, and n_sel2). The LSDC is connected to one of a pair of complimentary data lines, data 112 or data_1 114, respectively. These data lines (112 and 114) are connected to one of data line pairs (blp) through a turned-on column switch circuitry which is controlled by column selection (cls). The complementary data lines 112 and 114 are, in turn, connected to a sense amplifier and a write driver. The complementary data lines, data 112 and data_1 114, are inputs to the sense amplifier and outputs of the write driver.

Transistors m18 is coupled to data line, data 112, through transistor m5, to force a leakage stress to Vdd on data 112, and transistors m6 is coupled to data line, data_1 114, through transistor m4, to force a leakage to Vdd on data_1 114. Gates of transistor m18 and m6 are connected to a stress inducing (control) signal cpi, which gets the control signal from a induced leakage adjustment control (ILAC) coupled to the LSDC 130. The voltage level of stress inducing signal cpi controls the quantity of the leakage stress applied to the two data lines, data 112 and data_1 114, coupled to the LSDC 130. Gate of transistor m5 is connected to stress inducing signal p_sel2 and gate of transistor m4 is connected to stress inducing signal p_sel1, respectively. The leakage stress can be selectively applied to either one of the data lines, data 112 or data_1 114, both data lines, data 112 and data_1 114, or none by properly controlling the stress inducing signals p_sel1 and p_sel2, respectively.

Figure 2A:
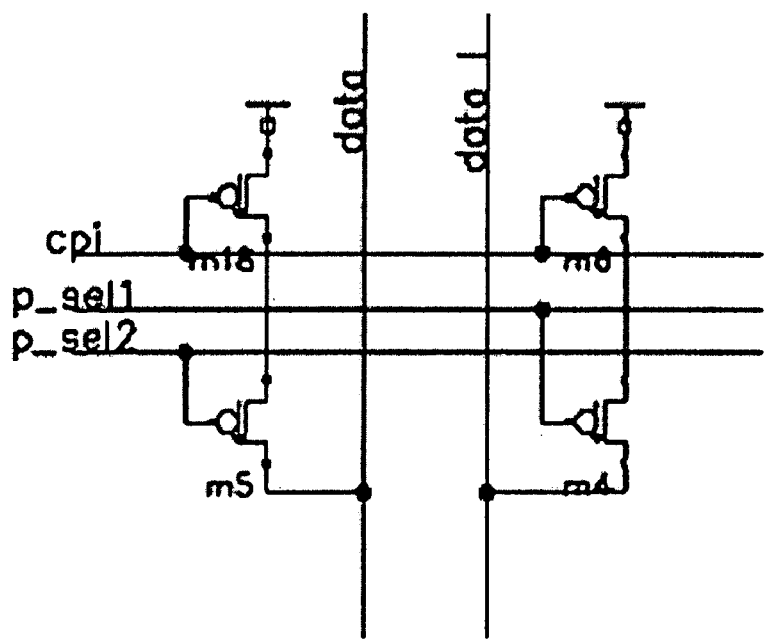
Figure 2B:
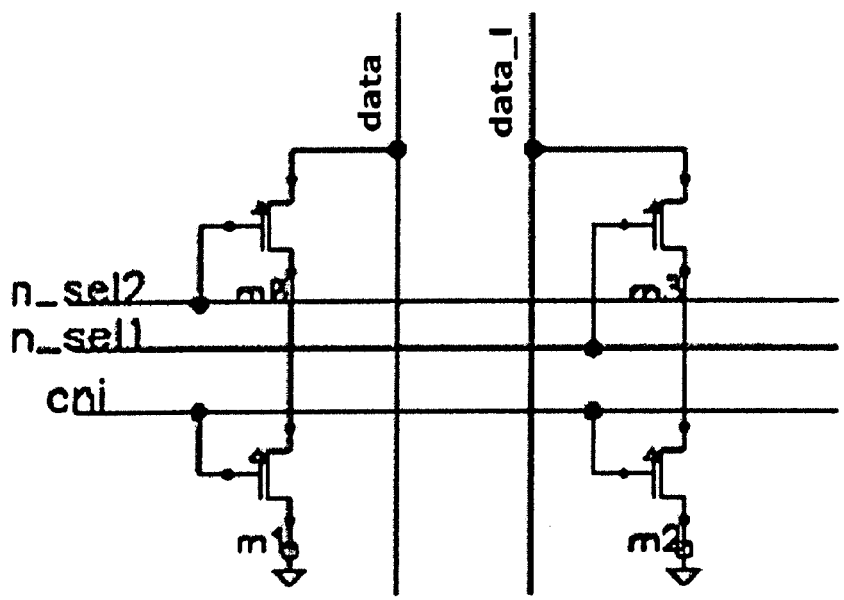

Transistors m1 is coupled to data line, data 112, through transistor m0, to force a leakage stress to Vss on data 112, and transistors m2 is coupled to data line, data_1 114, through transistor m3, to force a leakage to Vss on data_1 114. The gates of m1 and m2 are connected to stress inducing (control) signal cni, which gets the control signal from a induced leakage adjustment control (ILAC) coupled to the LSDC 130. The voltage level of stress inducing signal cni controls the quantity of the leakage stress applied to the two data lines, data 112 and data_1 114, coupled to the LSDC 130. Gate of transistor m0 is connected to stress inducing signal n_sel2 and gate of transistor m3 is connected to stress inducing signal n_sel1, respectively. The leakage stress can be selectively applied to either one of data lines, data 112 or data_1 114, both data lines, data 112 and data_1 114, or none by properly controlling n-sel1 and n_sel2 stress inducing signals, respectively. The LSDC is not restricted to a combination of PMOS and NMOS transistors but can be extended to include just the PMOS transistors or just the NMOS transistors, as illustrated in FIGS. 2A and 2B, respectively.

Figure 3A:
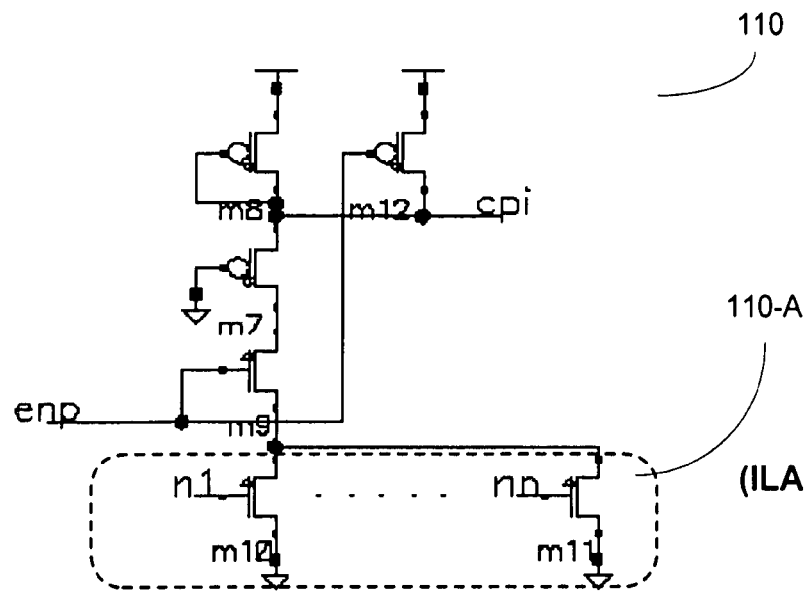
FIG. 3A illustrates a cpi generator of an induced leakage adjustment control, in one embodiment of the invention.

FIG. 3A illustrates a simplified circuitry of induced leakage adjustment control (ILAC) coupled to the LSDC 130, in one embodiment of the invention. The ILAC includes a cpi generator 110 that provides the leakage stress control as a stress inducing (control) signal cpi, which controls the leakage stress to the data lines through the PMOS transistors in the LSDC 130. The cpi generator 110 includes a plurality of PMOS (m7, m8, and m12) and NMOS transistors (m9, m10, m11, etc). Within the cpi generator, the gates of transistors m12 and m9 are connected to an enable signal, enp. If the enp is set to High, the cpi generator 110 is enabled and if the enable signal enp is set to Low, the cpi generator 110 is disabled. A leakage varying circuitry 110-A within the cpi generator 110 is used to adjust the voltage level of the stress inducing signal, cpi. The leakage varying circuitry 110-A includes a plurality of NMOS transistors m10, m11, etc. The gate nodes of these NMOS transistors represented by NMOS transistors n1 through nn, provide offset voltage that is used to adjust the leakage stress (cpi) applied at the LSDC 130. For instance, the voltage level of stress inducing signal, cpi, can be adjusted by turning on one or more number of NMOS transistors m10, m11, etc. As more NMOS transistors are turned on, the cpi signal applied to the LSDC 130 is offset more.

If the cpi is disabled (by setting the enp to Low) the voltage from the cpi is set to High which, in turn, shuts off PMOS transistors m18 and m6 within the LSDC 130 resulting in no leakage to Vdd on data lines, data 112 and data_1 114. With cpi disabled, none of the data lines will get the stress. With cpi enabled, the rest of stress inducing signals can be controlled to selectively apply leakage stress to one, both or none of the complementary data lines through the LSDC 130. The embodiments are not restricted to the six PMOS and NMOS transistors but additional transistors can also be included based on the level of fine-tuning or offsetting. Thus the cpi can further adjust the leakage stress applied to the PMOS transistors at the LSDC 130.

The leakage varying circuitry 110-A of the cpi generator 110 is activated when the enable signal, enp, is asserted. NMOS transistor m9 and PMOS transistor m12 are both connected to enable signal enp. When enp is at High, transistor m12 is turned off and transistor m9 is turned on. Transistor m7 is tied to ground and is turned on. In one embodiment, NMOS transistor m10 is enabled. Due to the turning on of the m7 transistor, the current from transistor m10 is driven all the way to transistor m8. The gate voltage of m8 offsets or drags the voltage level at the cpi. The adjusted cpi is then applied to the PMOS transistors at the LSDC 130 through data lines to force a leakage to Vdd. When the sense amplifier is asserted, the leakage stress applied to one or both of the data lines along with the selected memory cell current build up the voltage differential which is detected by the sense amplifier. If the selected memory cell is weak, the sense amplifier will fail to detect the voltage differential. The plurality of m10, m11 etc. transistors may be turned on and adjusted digitally so that fine-tuning of the leakage stress applied through the stress inducing signal cpi, can be accomplished.

Figure 3B:
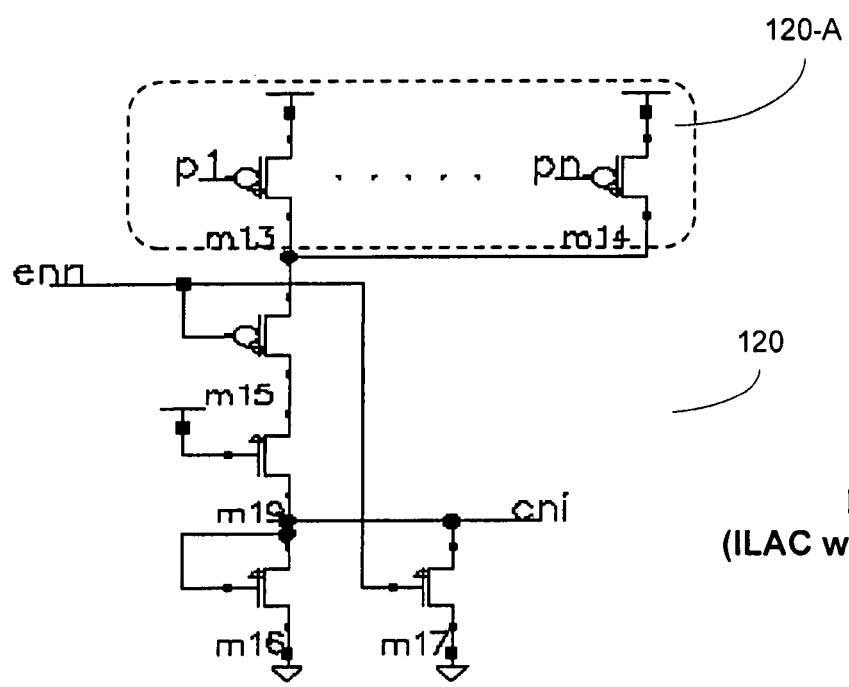
FIG. 3B includes a cni generator of an induced leakage adjustment control, in one embodiment of the invention.

FIG. 3B illustrates a variation of the simplified circuitry of induced leakage adjustment control (ILAC) described with reference to FIG. 3A. In this embodiment, the ILAC includes a cni generator 120 that provides the leakage stress control as a stress inducing (control) signal cni, which controls the leakage to the data lines through the NMOS transistors in the LSDC 130. The cni generator 120 includes a plurality of NMOS (m16, m17, and m19) and PMOS transistors (m15, m13, m14, etc). Within the cni generator, the gates of transistors m15 and m17 are connected to an enable signal, enn. If the enable signal enn is set to Low, the cni generator 120 is enabled and if the enable signal enn is set to High, the cni generator 120 is disabled. A leakage varying circuitry 120-A within the cni generator 120 is used to adjust the leakage stress of the stress inducing signal, cni. The leakage varying circuitry 120-A includes a plurality of PMOS transistors m13, m14, etc. The gate nodes of which are represented by p1 through pn. These nodes provide the digital programming control that is used to adjust the leakage stress applied to the NMOS transistors at the LSDC 130 through the stress inducing signal cni, as explained further below. For instance, the voltage level of stress inducing signal cni can be adjusted by turning on one or more number of PMOS transistors m13, m14, etc. As more PMOS transistors are turned on, the cni signal applied to the LSDC 130 is offset more.

If the cni is disabled (by setting the enn signal to High), the voltage at the cni becomes Low which, in turn, shuts off NMOS transistors m1 and m2 within the LSDC 130 resulting in no leakage to Vss on data lines, data 112 and data_1 114. The embodiments are not restricted to the number of PMOS and NMOS transistors illustrated in FIG. 3B but additional transistors can also be included based on the level of fine-tuning or offsetting. Thus, the cni can further adjust the leakage stress applied to the NMOS transistors at the LSDC 130.

The leakage varying circuitry 120-A of the cni generator 120 works when the enabled signal, enn, is asserted. PMOS transistor m15 and NMOS transistor m17 are both connected to enable signal enn. When enn is at Low, transistor m17 is turned off and transistor m15 is turned on. Transistor m19 is tied to power supply Vss and is turned on. In one embodiment, a PMOS transistor p1 at m13 is enabled. Due to the turning on of the m19 transistor, the current from transistor m13 is driven all the way to transistor m16. The gate voltage of m16 offsets or drags the voltage level at the cni. The adjusted leakage stress cni is then applied to the NMOS transistors at the LSDC 130 through the data lines to force a leakage to Vss. The adjusted leakage stress on the data line causes voltage differential change between the data lines during a read or write operation that may be used to establish a pass/fail threshold for a sense amplifier. The plurality of m13 and m14 transistors may be turned on and adjusted digitally so that fine-tuning of the leakage stress applied through the stress inducing signal cni, can be accomplished.

FIG. 6 illustrates a sample input control table for a cell using an induced leakage adjustment control. As indicated, by controlling the various stress inducing signals, the leakage stress to the data lines can be adjusted. The control table indicates the controls of leakage current through various PMOS and NMOS transistors within the leakage stress delivery circuitry based on the stress inducing signals. For instance, when stress inducing signal p_sel1 is set to High and the other stress inducing signals p_sel2, n_sel1 and n_sel2 are set to Low, leakage stress is forced on to Vdd on data line data 112 through PMOS transistors m18 and m5. The leakage is controlled by voltage level of cpi.

Figure 4A:
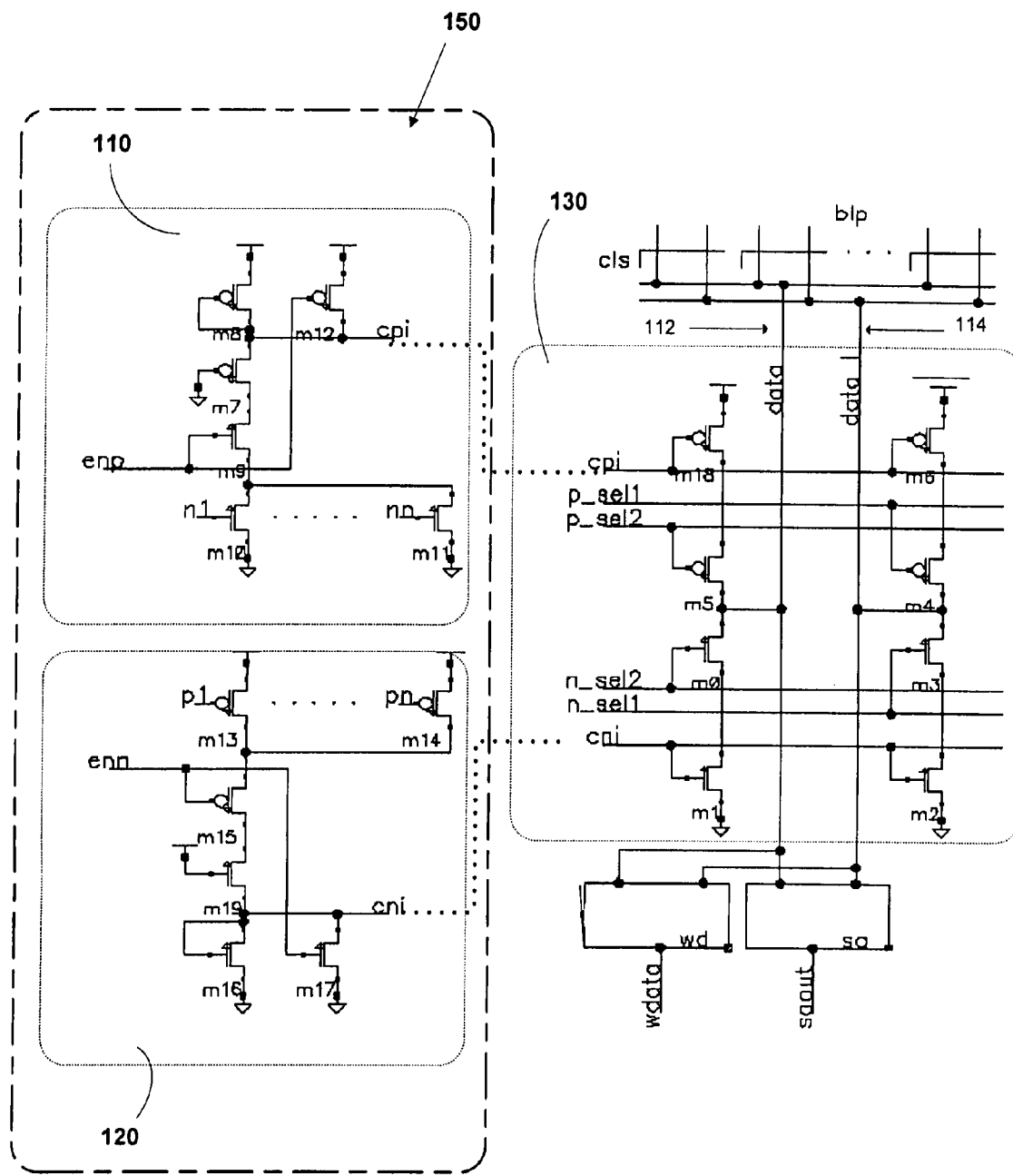
FIGS. 4A, 4B and 4C illustrate a sample leakage stress delivery circuitry coupled to a variable leakage adjustment control to provide leakage stress to a combination of PMOS transistors, NMOS transistors, or both PMOS transistors and NMOS transistors, in one embodiment of the invention.
Figure 4B:
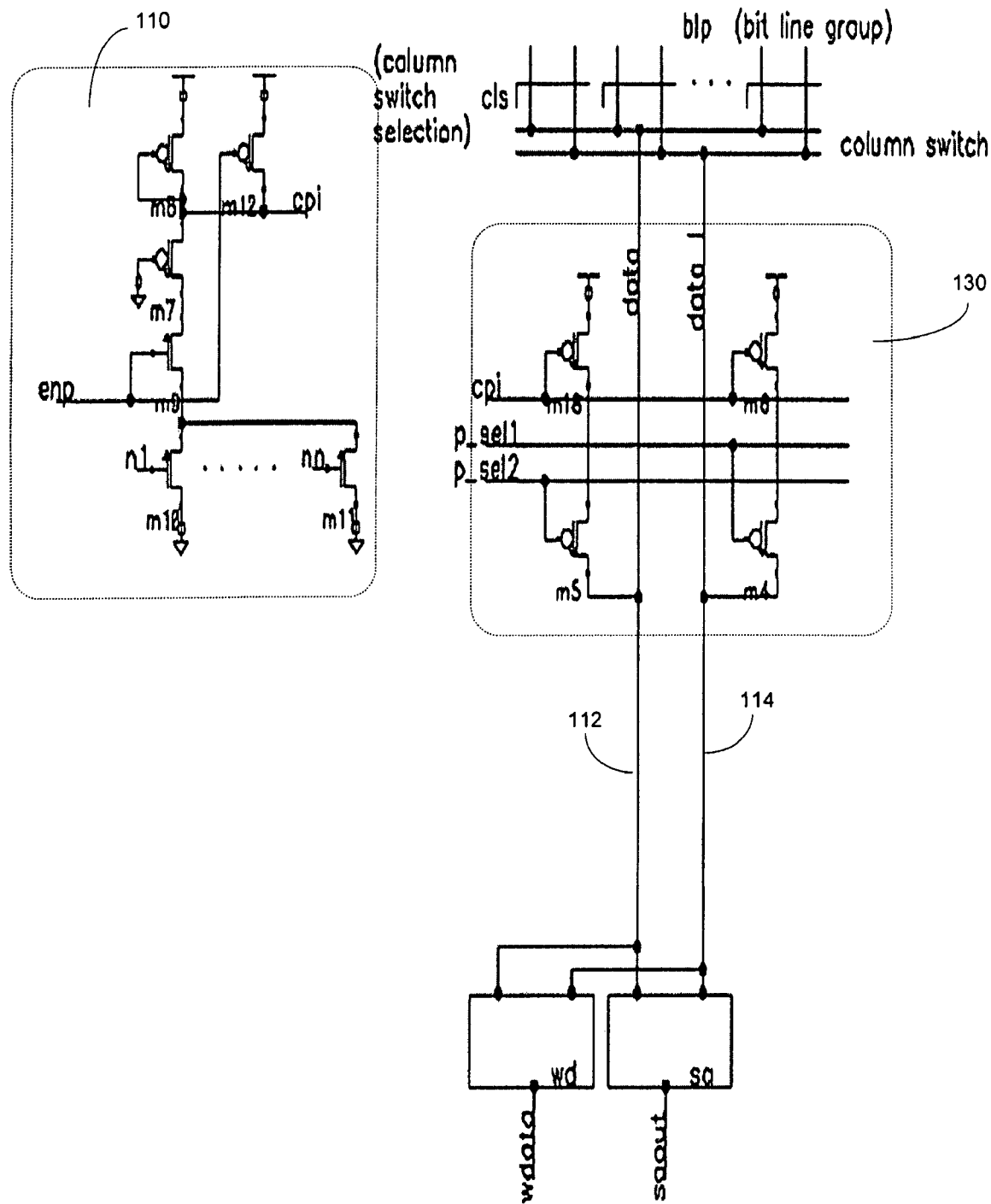
Figure 4C:
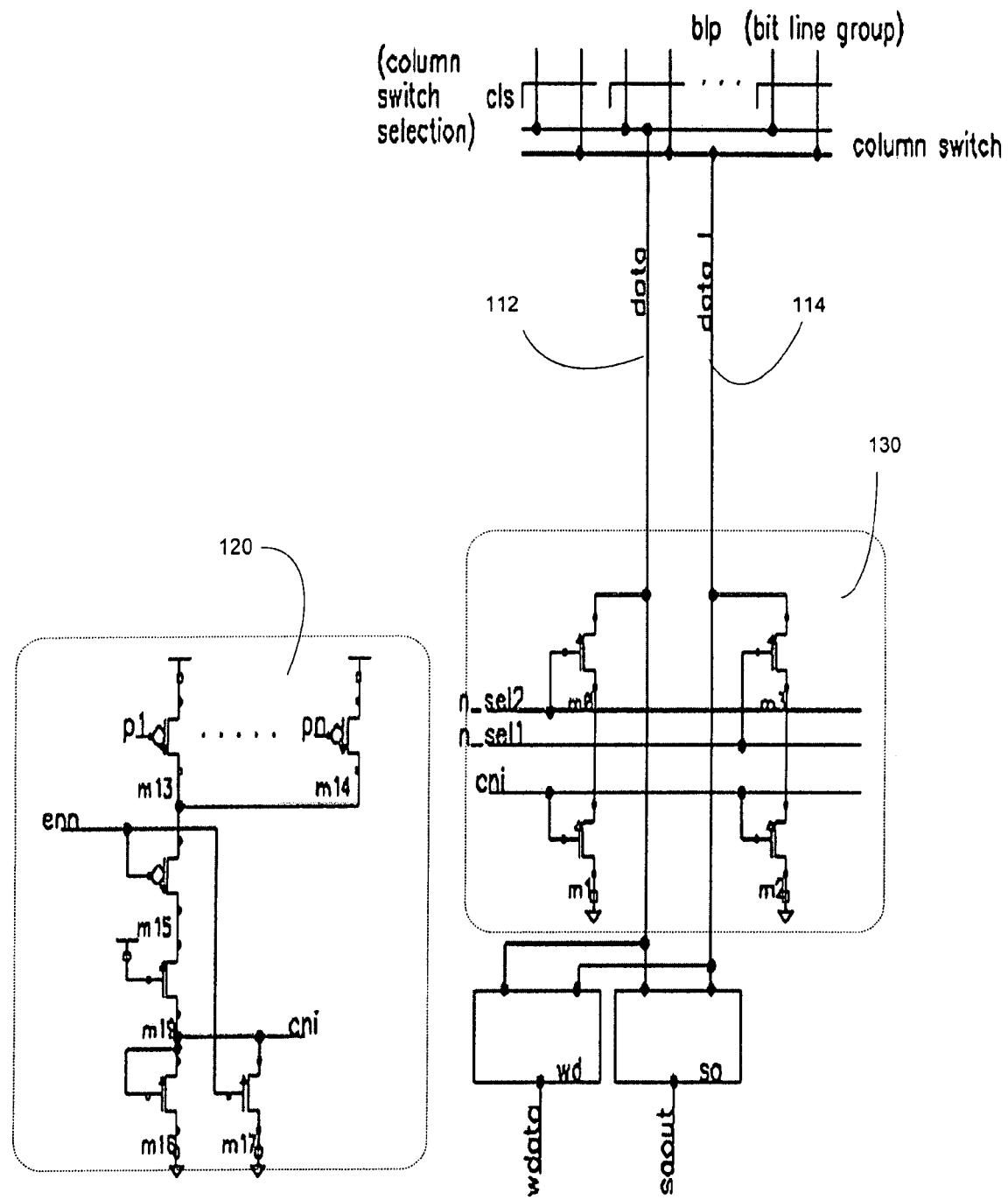

FIG. 4A illustrates a sample circuitry that includes a leakage stress delivery circuitry (LSDC) 130 coupled to data lines and induced leakage adjustment control (ILAC) 150, in one embodiment of the invention. As illustrated, the ILAC 150 includes both a cpi generator 110 that provides stress inducing signal cpi to the PMOS transistors within the LSDC 130, and a cni generator 120 that provides a stress inducing signal cni to the NMOS transistors within the LSDC 130. The structure and function of the LSDC 130 and ILAC 150 are explained in great detail with reference to FIGS. 2, 3A and 3B. It is noteworthy that the present invention is not limited to the architecture of FIG. 4A but may include alternate embodiments wherein the LSDC 130 includes only PMOS transistors and the ILAC 150 includes only a cpi generator 110 to provide stress inducing signal cpi to the PMOS transistors within the LSDC 130 as illustrated in FIG. 4B, or the LSDC 130 includes only NMOS transistors and the ILAC 150 includes only a cni generator 120 to provide stress inducing signal cni to the NMOS transistors within the LSDC 130 as illustrated in FIG. 4C.

It is noteworthy that the present invention is not limited to the architecture of FIG. 1. For example, 4 transistors SRAM or a pseudo SRAM may be used to implement the various aspects of the present invention. Additionally, any circuit with a plurality of PMOS and NMOS transistors may use the concept of applying stress leakage current along the data lines to detect and track process variations. It's not strictly necessary to have two data lines (data line and complementary data line).

Figure 5A:
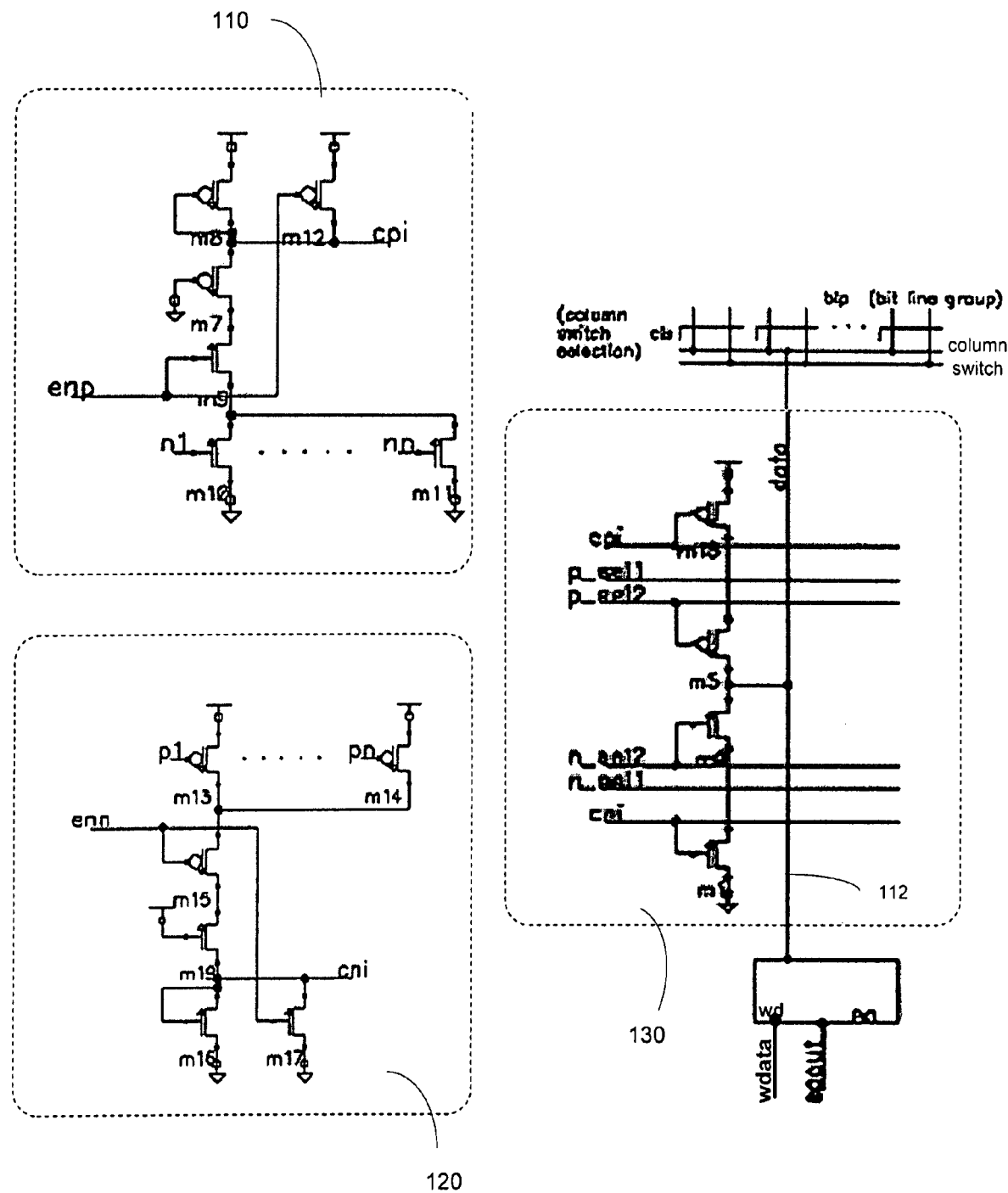
FIG. 5A illustrates a sample circuitry engaging a single ended sense amplifier and a variable leakage adjustment control for providing variable leakage stress, in one embodiment of the invention.
Figure 5B:
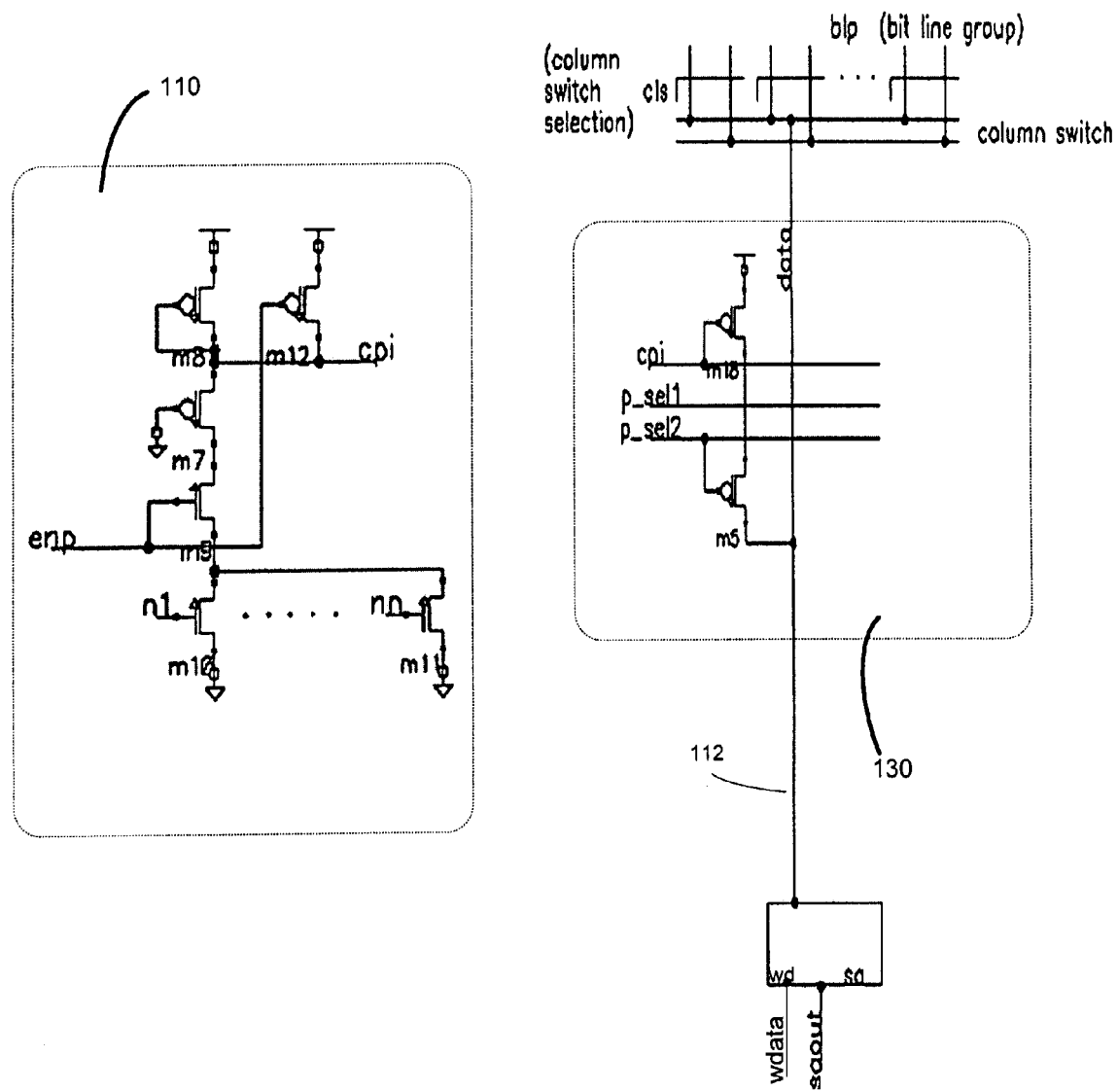
FIG. 5B illustrates an alternate embodiment depicted in FIG. 5A, with a cpi generator having a plurality of NMOS transistors for providing variable leakage stress, in another embodiment of the invention.
Figure 5C:
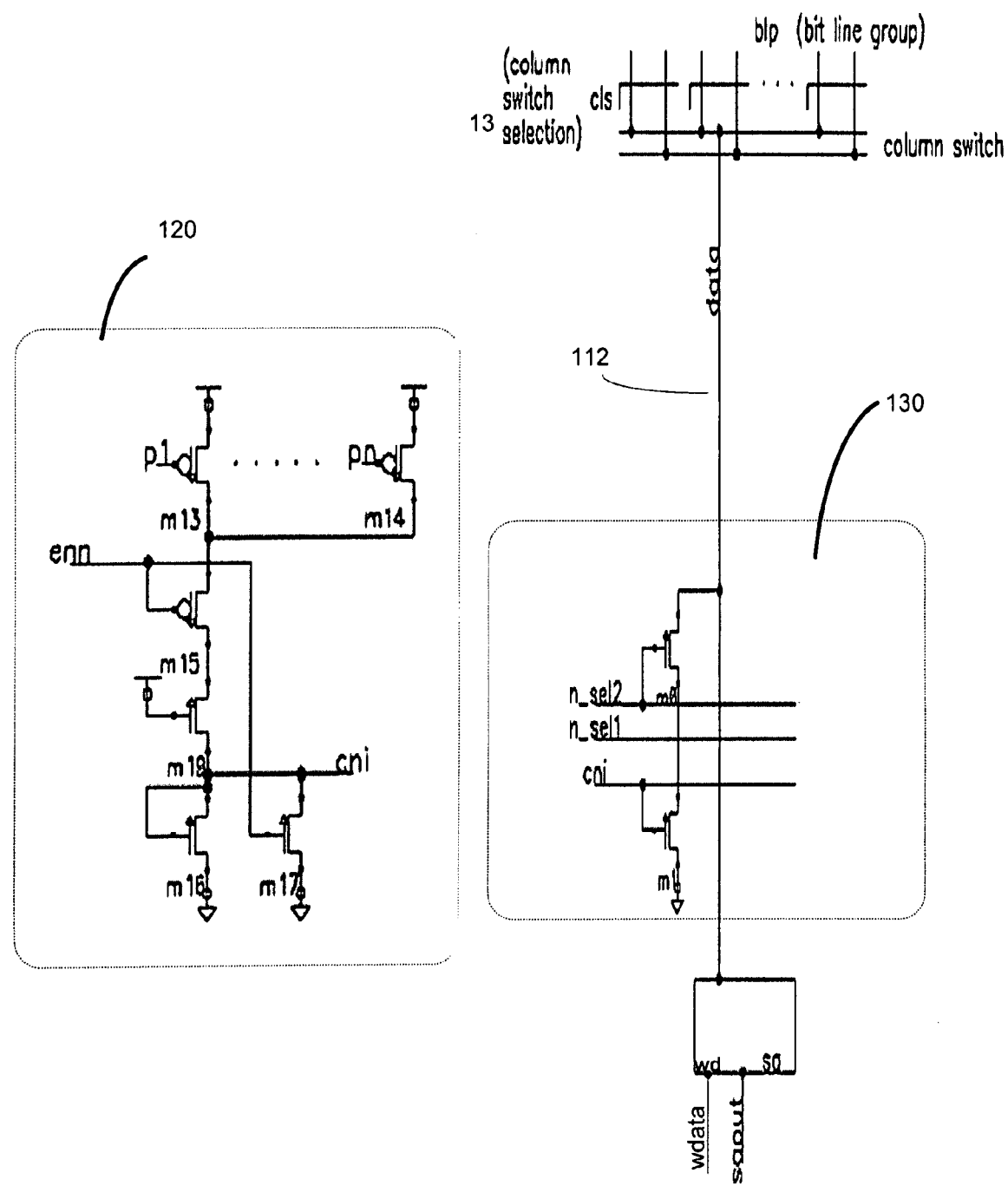
FIG. 5C illustrates an alternate embodiment depicted in FIG. 5A, with a cni generator having a plurality of PMOS transistors for providing variable leakage stress, in another embodiment of the invention.

In another embodiment of the invention illustrated in FIGS. 5A through 5C, a single-ended sense amplifier is used in detecting signals generated on a single data line. A single-ended sense amplifier is a non-differential type of sense amplifier for detecting and amplifying signals generated by a cell on a data line. Accordingly, the single-ended sense amplifier receives signals from a single data line instead of a pair of complementary data lines. As illustrated in FIG. 5A, the circuitry for a single-ended sense amplifier includes a leakage stress delivery circuitry (LSDC) 130 coupled to a cell and an induced leakage adjustment control (ILAC) coupled to the LSDC 130. The LSDC 130 includes a plurality of PMOS and NMOS transistors (m18, m5, m0 and m1). The PMOS transistors m18 and m5 are connected to the data line, data 112, to force a leakage stress to Vdd and the NMOS transistors m0 and m1 are coupled to data 112 to force a leakage to Vss. The data line, data 112, is connected to a single-ended sense amplifier and a write driver and act as input to the single-ended sense amplifier and output of the write driver.

The PMOS and NMOS transistors of the LSDC 130 are controlled by a plurality of stress inducing signals, cpi, p_sel2, cni, and n_sel2. The gate of PMOS transistor m5 is connected to stress inducing signal p_sel2. The gate of PMOS transistor m18 is connected to a stress inducing (control) signal cpi and gets a control signal from a cpi generator 110 in the ILAC coupled to the LSDC 130. The cpi generator 110 is similar in structure and function as explained with reference to FIG. 3A. The gate of NMOS transistor m0 is connected to stress inducing signal n_sel2. The gate of NMOS transistor m1 is connected to a stress inducing signal cni and gets a control signal from a cni generator 120 in the ILAC coupled to the LSDC 130. The ILAC includes a cni generator 120 that is similar in structure and function as explained with reference to FIG. 3B. It is noteworthy that the present invention is not limited to the architecture of FIG. 5A but may include alternate embodiments wherein the LSDC 130 includes only a plurality of PMOS transistors and the ILAC 150 includes only a cpi generator 110 to provide stress inducing signal cpi to the PMOS transistors within the LSDC 130 as illustrated in FIG. 5B, or the LSDC 130 includes only a plurality of NMOS transistors and the ILAC 150 includes only a cni generator 120 to provide stress inducing signal cni to the NMOS transistors within the LSDC 130 as illustrated in FIG. 5C.

A read operation in an SRAM cell using the disclosed scheme proceeds as follows. To begin with, a sense amplifier is switched off and the pair of complementary data lines are pre-charged using a pre-charge circuit (not shown). The SRAM cell is normally selected using column and row addresses. The word line for the selected row is asserted using a word line driver (not shown) that identifies the SRAM cell. The selected SRAM cell is turned on by turning on the pass gates of the NMOS pass transistors within the selected SRAM cell allowing the contents of the selected SRAM cell to be transferred to the bit lines by leaving the appropriate voltage, reflective of the value in the selected SRAM cell, on one bit line and discharging the corresponding complementary bit line and hence data line through switch to a logical Low. With sufficient differential voltage developed between the two complementary data lines, data 112 and data_1 114, a sense amplifier is able to detect the data in the selected SRAM cell correctly, when enabled.

Consider, for example, the selected SRAM cell is turned on and is driving data line, data 112, going low. A leakage stress is selectively applied to one or both of the data lines by turning on one or more of a plurality of PMOS and/or NMOS transistors within the leakage varying circuitry 110-A or 120-A of the corresponding ILAC 150, and proper PMOS/NMOS in LSDC 130. If a leakage stress is applied to data line, data 112, the voltage on the data line, data 112, is adjusted accordingly. This results in the going-low action of the data line, data 112, to become slower and a less voltage differential is developed between the two complementary data lines due to the adjustment made at the data line, data 112. A sense amplifier is used to measure the voltage differential between the two data lines to determine if the cell is weak or not. The leakage stress applied to the data lines is adjusted and re-adjusted to establish a pass/fail threshold at which the sense amplifier will be able to distinguish a strong SRAM cell from a weak SRAM cell, when asserted. When the sense amplifier is asserted, a normal cell will be able to overcome the applied leakage stress and develop enough voltage differential between the two data lines for the activated sense amplifier to detect while a weak cell is unable to overcome the leakage stress and is, therefore, unable to develop the voltage differential for the sense amplifier to detect promptly.

Thus, the embodiments of the invention define a way for applying a leakage stress to the data lines for exposing weaker cells in a circuit. As mentioned earlier, the embodiments of the invention can be extended to any type of circuit wherein a leakage current may be applied along the data lines to expose weak cells. This leads to an effective way of identifying weak cells from normal cells while preserving the cells' structure and functionality. Further, the leakage stress delivery circuitry (LSDC) 130 and the induced leakage adjustment control (ILAC) are simple circuitry that can be accommodated on an IO slice of a memory circuitry resulting in a small overhead. By placing the LSDC 130 and ILAC circuitry corresponding to a cell at the respective IO slice, optimal use of the space in the memory block is accomplished. The solution is easy to implement and provides for greater flexibility by allowing the leakage stress to be applied to either one of the data lines, to both data lines or to none of the data lines by controlling the stress inducing signals when applying the leakage stress to the data lines at the LSDC 130.

For a write operation, the embodiments of the invention use LSDC 130 along with a normal write circuitry to adjust the voltage on the data lines to establish a pass/fail threshold for a successful write screening (write) operation. FIG. 4A illustrates an embodiment of the invention that is used in the write operation. In this case, the leakage stress delivery circuitry 130 coupled to data lines, data 112 and data_1 114, are adjusted during write operation along with write driver (wd). A write operation is performed by turning on normal write transistor(s), and adjusting data line voltage by turning on desired stress inducing signals to force the data or data_1 to go higher than normal Low, or lower than normal High. Setting the word line high would start to transfer data line value to the selected memory cell. A normal or easy-to-write/disturb cell can be written without enabling LSDC 130 with a significant margin. By enabling proper leakage stress to the data lines via LSDC 130, this margin can be varied slightly or significantly. A small stress allows identification of the hard-to-write cells which can just be written by the normal write circuitry but fail with the slightly reduced margin applied via LSDC 130. Similarly, with a larger stress, only an easy-to-write/disturb cell would be written, normal or hard-to-write cells would fail. By properly adjusting these two stress levels for the array and the test conditions, hard-to-write and easy-to-write/disturb cells can be screened.

As an example of weak write test for a six-transistor SRAM cell illustrated in FIG. 1, this proposed circuits can effectively screen out weak PMOS in memory cell (P1 & P2, FIG. 1). The write screening process can be described as follows. First, all the memory cells are initially written by normal write with data "one" which is the background pattern. Next, LSDC 130 and ILAC 150 are turned on. All the memory cells are subject to weak write with data "zero" and use weak write with data "one" to screen out the weak PMOS (P1 in FIG. 1, for example) of the memory cell(s).

Although various embodiments of the invention have been described in great detail with reference to applying leakage stress to the data lines so that a sense amplifier can detect the voltage differential, the teachings of the current invention are not restricted to data lines and may be extended to include bit lines for applying leakage stress and for providing the same functionality as that provided by data lines. It will be obvious to one skilled in the art, that the present invention may be practiced without some or all of these specific details. In other instances, well known process operations have not been described in detail in order not to unnecessarily obscure the present invention.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An apparatus for effectively screening a weak cell in a circuit, the apparatus comprising:
    a leakage stress delivery circuitry (LSDC) coupled to a cell, the LSDC comprising a combination of PMOS transistors, NMOS transistors, or PMOS transistors and NMOS transistors, the LSDC controlled by a plurality of stress inducing signals, the LSDC coupled to at least one of a pair of complementary data lines, the complementary data lines further connected to a sense amplifier and a write driver; and
    an induced leakage adjustment control (ILAC) coupled to the LSDC to control the quantity of the leakage stress applied to the pair of complementary data lines through the LSDC, the ILAC further having a leakage varying circuitry configured to adjust leakage stress control applied to the LSDC, so that the applied leakage stress to the data lines from LSDC is adjusted to allow the sense amplifier to detect and track a desired pass/fail threshold and other process variations of the selected cell,
    wherein the plurality of stress inducing signals are controlled to apply the appropriate leakage stress through the LSDC to the pair of complementary data lines.

2. The apparatus for effectively screening weak cell in a circuit of claim 1, wherein the leakage stress delivery circuitry and induced leakage adjustment control are maintained on an Input-Output slice to save space in the circuit (memory cell array).

3. The apparatus for effectively screening weak cell in a circuit of claim 1, wherein the leakage stress can be selectively applied through the LSDC to force a leakage to any one of the Vdd, the Vss or both Vdd and Vss, the leakage stress applied to anyone of the complementary data lines, both of the complementary data lines or none of the complementary data lines by selectively controlling the one or more of the plurality of stress inducing signals.

4. The apparatus for effectively screening weak cell in a circuit of claim 3, wherein the leakage stress control is selectively applied to the leakage stress delivery circuitry such that the leakage stress forced to the Vdd is complementary to the leakage stress forced to the Vss.

5. The apparatus for effectively screening weak cell in a circuit of claim 3, wherein the leakage stress control is selectively applied to the leakage stress delivery circuitry such that the leakage stress forced to the Vdd is different than the leakage stress forced to the Vss.

6. The apparatus for effectively screening weak cell in a circuit of claim 1, wherein the leakage varying circuitry is controlled digitally to adjust leakage stress to screen weak cell based on the defined pass/fail threshold.

7. The apparatus for effectively screening weak cell in a circuit of claim 1, wherein the ILAC includes a cpi generator to provide the leakage stress control to the PMOS transistors in the LSDC, the leakage stress control from the ILAC adjusted using the leakage varying circuitry coupled to the cpi generator, the leakage varying circuitry controlled by a plurality of NMOS transistors.

8. The apparatus for effectively screening weak cell in a circuit of claim 7, wherein the leakage stress control is adjusted digitally by turning on and adjusting a single NMOS transistor from the plurality of NMOS transistors.

9. The apparatus for effectively screening weak cell in a circuit of claim 7, wherein the leakage stress control is adjusted by digitally turning on and adjusting a plurality of NMOS transistors.

10. The apparatus for effectively screening weak cell in a circuit of claim 1, wherein the ILAC includes a cni generator to provide the leakage stress control to the NMOS transistors in the LSDC, the leakage stress control from the ILAC adjusted using the leakage varying circuitry coupled to the cni generator, the leakage varying circuitry controlled by a plurality of PMOS transistors.

11. The apparatus for effectively screening weak cell in a circuit of claim 10, wherein the leakage stress control is adjusted by digitally turning on and adjusting a single PMOS transistor from the plurality of PMOS transistors.

12. The apparatus for effectively screening weak cell in a circuit of claim 7, wherein the leakage stress control is adjusted by digitally turning on and adjusting a plurality of PMOS transistors.

13. The apparatus for effectively screening weak cell in a circuit of claim 1, further including a normal write driver circuitry coupled to the LSDC, wherein the write driver circuitry includes a write driver to provide baseline voltage level of data line when enabled, the LSDC selectively enabled to control and adjust voltage level on data lines during write screening operation, the adjustment of voltage on data lines establishing a pass/fail threshold of the cell during the write screening operation.

14. The apparatus for effectively screening weak cell in a circuit of claim 13, wherein the adjustment of voltage on data lines is through leakage stress received from any one of the cni generator, cpi generator or both cni and cpi generators of the ILAC coupled to the LSDC, the adjustment of voltage enabling screening of easy-to-write/disturb cell.

15. The apparatus for effectively screening weak cell in a circuit of claim 13, wherein the adjustment of voltage on data lines is through leakage stress received from any one of cni generator, cpi generator or both cni and cpi generators of the ILAC coupled to the LSDC, the adjustment of voltage enabling screening of hard-to-write cell.

* * * * *